United States Patent
Han

[11] Patent Number: 5,845,663
[45] Date of Patent: Dec. 8, 1998

[54] WAFER WET PROCESSING DEVICE

[75] Inventor: Suk-Bin Han, Chungcheongbuk-do, Rep. of Korea

[73] Assignee: LG Semicon Co., Ltd., Chungcheongbuk-do, Rep. of Korea

[21] Appl. No.: 803,640

[22] Filed: Feb. 21, 1997

[30] Foreign Application Priority Data

Mar. 13, 1996 [KR] Rep. of Korea .......................... 96-6618

[51] Int. Cl.⁶ ........................................................ B08B 3/04
[52] U.S. Cl. ............................ 134/155; 134/186; 134/902
[58] Field of Search .................... 134/182, 155, 134/186, 902, 1.3, 184, 111

[56] References Cited

U.S. PATENT DOCUMENTS

| | | |
|---|---|---|
| 3,923,156 | 12/1975 | Wallestad . |
| 4,899,767 | 2/1990 | McConnell et al. ..................... 134/186 |
| 4,949,848 | 8/1990 | Kos . |
| 5,014,727 | 5/1991 | Aigo . |
| 5,071,776 | 12/1991 | Matsushita et al. . |
| 5,275,184 | 1/1994 | Nishizawa et al. ..................... 134/902 |
| 5,383,484 | 1/1995 | Thomas et al. .......................... 134/902 |

FOREIGN PATENT DOCUMENTS

| | | | |
|---|---|---|---|
| 61-154130 | 7/1986 | Japan ..................................... 134/902 |
| 2178594 | 2/1987 | Japan ..................................... 134/902 |
| 64-57721 | 3/1989 | Japan ..................................... 134/902 |
| 2-44727 | 2/1990 | Japan ..................................... 134/902 |
| 2-58835 | 2/1990 | Japan ..................................... 134/902 |
| 3-191523 | 8/1991 | Japan ..................................... 134/902 |
| 3-222420 | 10/1991 | Japan ..................................... 134/902 |
| 5-62956 | 3/1993 | Japan ..................................... 134/902 |
| 5-102119 | 4/1993 | Japan ..................................... 134/902 |
| 5-82496 | 4/1993 | Japan ..................................... 134/902 |

Primary Examiner—Frankie L. Stinson
Attorney, Agent, or Firm—Birch, Stewart, Kolasch & Birch, LLP

[57] ABSTRACT

A wafer wet processing device which comprises a processing container containing side walls; means for introducing a processing solution to the lower portion of said container; means for removing the processing solution from the upper portion of said container; and a wafer carrier containing side walls and being open at the top and bottom thereof, said wafer carrier being slidably disposed within said processing chamber, wherein at least the lower portion of the side walls of said processing container is contiguous with the lower portion of the side walls of said wafer carrier so that the entirety of the processing solution is introduced within the wafer carrier.

12 Claims, 7 Drawing Sheets

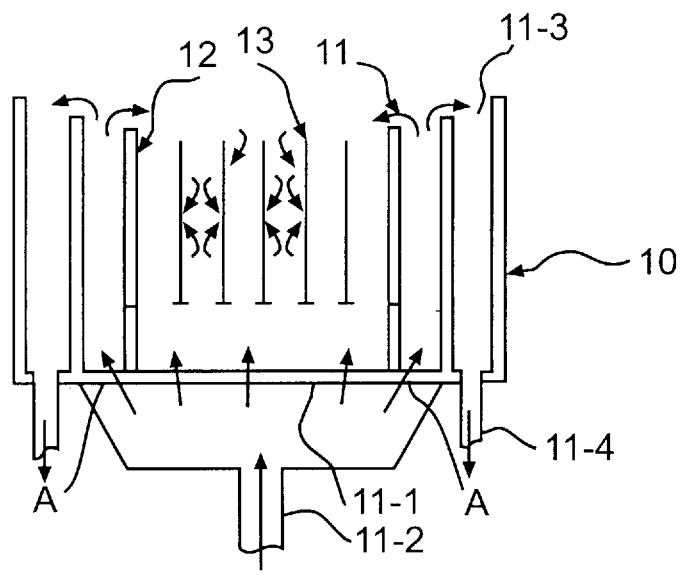
FIG. 1A
CONVENTIONAL
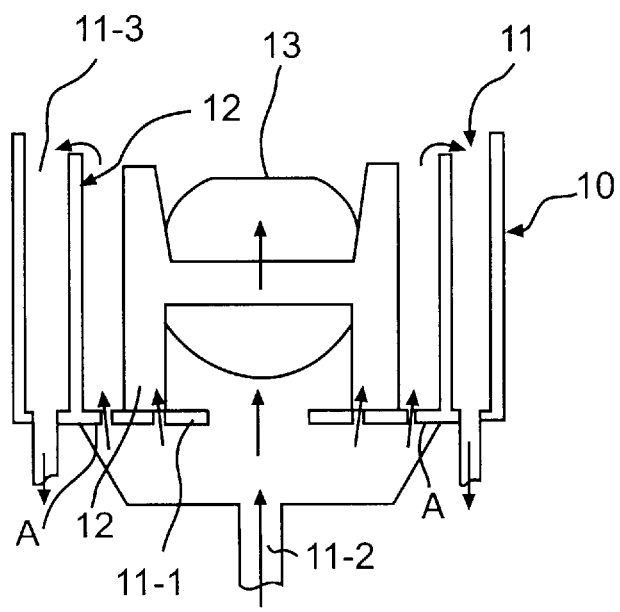
FIG. 1B
CONVENTIONAL

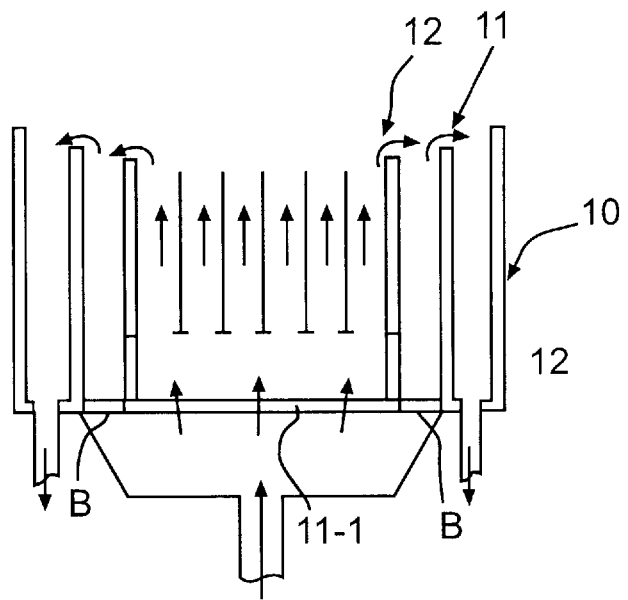
FIG. 2A
CONVENTIONAL
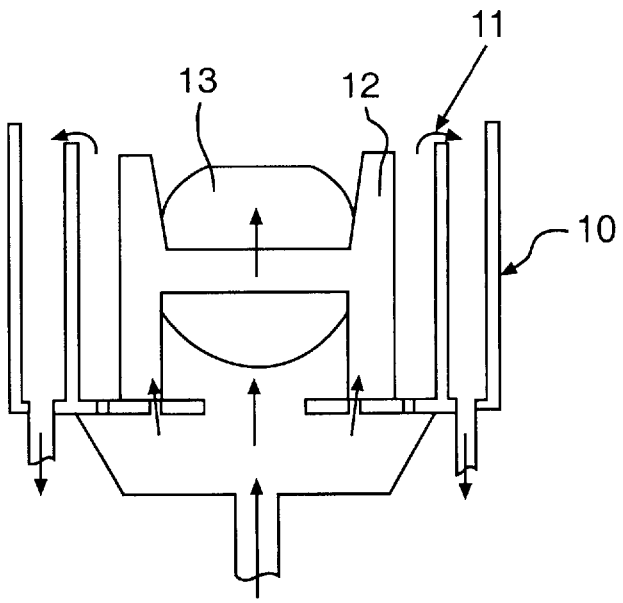
FIG. 2B
CONVENTIONAL

WAFER WET PROCESSING DEVICE

BACKGROUND OF THE INVENTION

1. Field of the Invention

The present invention relates to a wafer wet processing device and, more particularly, to a wafer wet processing device used for cleaning or conducting a chemical reaction of a wafer in a process for producing a semiconductor device.

2. Discussion of Related Art

In general, a wafer wet processing device is a method for inserting a wafer carrier containing a plurality of wafers into a processing bath, and introducing a processing solution from the bottom thereof which flows through the processing bath. The basic construction of a conventional device is a processing bath which uses an overflow system as shown in U.S. Pat. No. 5,071,776. There are the U-shaped type wafer carriers as described in U.S. Pat. No. 3,923,156 and the H-shaped type.

FIGS. 1A and 1B are cross-sectional views showing conventional basic wafer wet processing devices. A conventional device as shown is composed of a processing bath 11 in which a processing solution flows into the bath through a baffle plate 11-1. A wafer carrier 12 is inserted into the processing bath. The bottom of the device is made of the baffle plate, the upper and lower face of the wafer carrier 12 are open, and a plurality of wafers 13 are disposed in an upright position within the carrier 12, and inserted in this state without thoroughly covering the bottom of the processing bath 11. Thus, the baffle plate 11-1, because of the girth of the body, is less than that of the bottom of the processing bath.

Element 11-2 is a conduit for introducing the processing solution to the system; element 11-3 is a processing solution exhaust conduit, and element 11-4 is an exhaust hole.

Accordingly, a conventional wafer wet processing device 10 utilizes a processing solution, such as a cleaning solution, for the wet-processing of wafers in a wafer carrier 12. The processing solution, which flows up and down in the processing bath through the baffle plate 11-1 disposed at the bottom of a processing bath, flows over the walls of the bath. The processing solution flows out of the exhaust conduit through an exhaust hole 11-4. This solution can be discarded as waste or recirculated.

In the conventional device as shown in FIGS. 1A and 1B, since the wafer carrier 12 does not completely cover the baffle plate 11-1 and thus does not block the flow of the processing solution in the outside portion of the wafer carrier 12, because the outside portion of the wafer carrier is wider than the interval between wafers in the carrier (see the periphery portion "A" shown in the drawing of the baffle plate 11-1), the main flow between the wafers is prevented by the reverse-flow in the carrier 12. This is not effective for cleaning wafers and establishing a chemical reaction.

FIG. 2 is a cross-sectional view showing a wafer wet processing device which solves this problem by closing the periphery portion ("B" shown in the drawing) of the baffle plate 11-1 of the processing bath without relying upon a carrier to provide such a covering. This is disclosed in the article "Special Baffle Plate" on page 94 of "ULSI ULTRA CLEAN TECHNOLOGY 24TH SYMPOSIUM."

The conventional device shown in FIG. 2 increases the effect of cleaning wafers and chemical reaction by reducing the flowing of unnecessary processing solution outside of the carrier 12. However, it is not desirable that a processing solution which flows over the wafer carrier still remains since the wall of the wafer carrier has a "U" or "H" configuration, and the unnecessary space outside the wafer carrier in the processing bath 11 brings about enlarging the device.

SUMMARY OF THE INVENTION

Accordingly, the present invention is directed to a wafer wet processing device that substantially obviates one or more of the problems due to the limitations and disadvantages of the related art.

An object of the present invention is to provide a wafer wet processing device wherein the processing effect is maximized utilizing a device with an optimum size, by removing space in the processing bath and eliminating the flow of unnecessary processing solution.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, the wafer wet processing device comprises: a processing bath or container which utilizes a processing solution which is introduced into the bottom of the processing bath and flows over a wall thereof; and a wafer carrier is inserted into said processing bath having a bottom thereof and an upper face which is open. The lower portion of an outer face of said wall contacts with said processing bath wall, and said processing solution passes through the inside of said wall.

It is to be understood that both the foregoing general description and the following detailed description are exemplary and explanatory and are not intended to limit the invention as claimed.

In another aspect, the present invention provides a wafer carrier which is inserted into a processing bath, whereby the outer face of said carrier wall is in contact with the inner face of said processing bath wall. Also, a predetermined angle can be provided between a portion of the wall or between the overall inner wall of the processing bath and the outer face of said carrier wall. Thus, the outer face of said carrier wall is an inclined face, and the upper of said wall portions of said carrier wall is outwardly inclined and defines a flow guide which contacts with said processing bath wall.

BRIEF DESCRIPTION OF THE DRAWINGS

The accompanying drawings, which are included to provide a further understanding of the invention and are incorporated in and constitute a part of this specification, illustrate embodiments of the invention and together with the description, serve to explain the principles of the drawings, wherein:

FIGS. 1A and 1B are views showing a conventional wafer wet processing device;

FIGS. 2A and 2B are views showing a conventional wafer wet processing device;

DETAILED DESCRIPTION OF PREFERRED EMBODIMENTS

Reference will now be made in detail to the preferred embodiments of the present invention, examples of which are illustrated in the accompanying drawings.

The preferred embodiments according to the present invention will be described in detail with reference to FIGS. 3A, 3B, 3C, 4A, 4B, 4C, and FIGS. 5A and 5B.

Figure 3A:
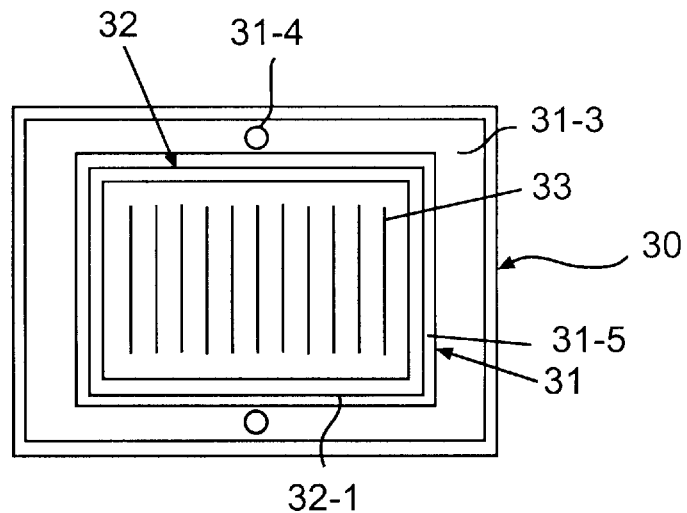
FIGS. 3A, 3B, and 3C are views showing an embodiment of a wafer set processing device according to the present invention.
Figure 3B:
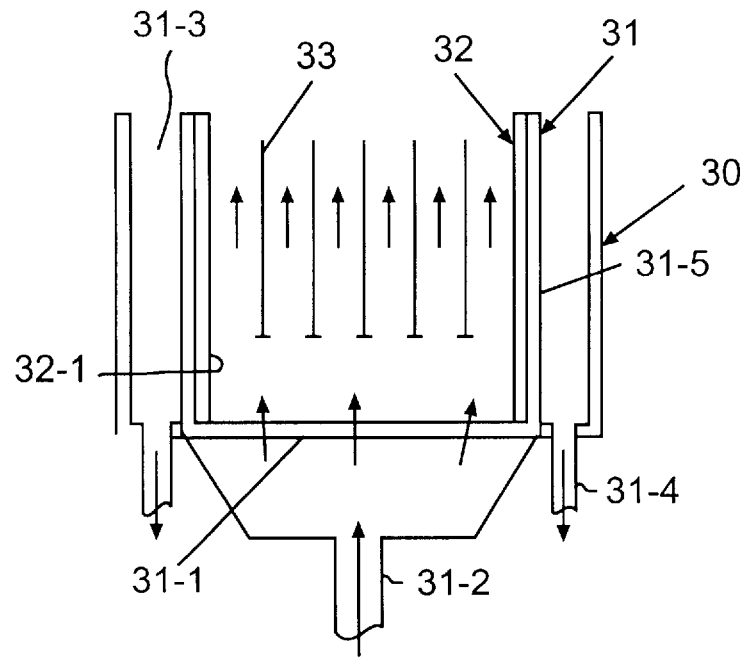
Figure 3C:
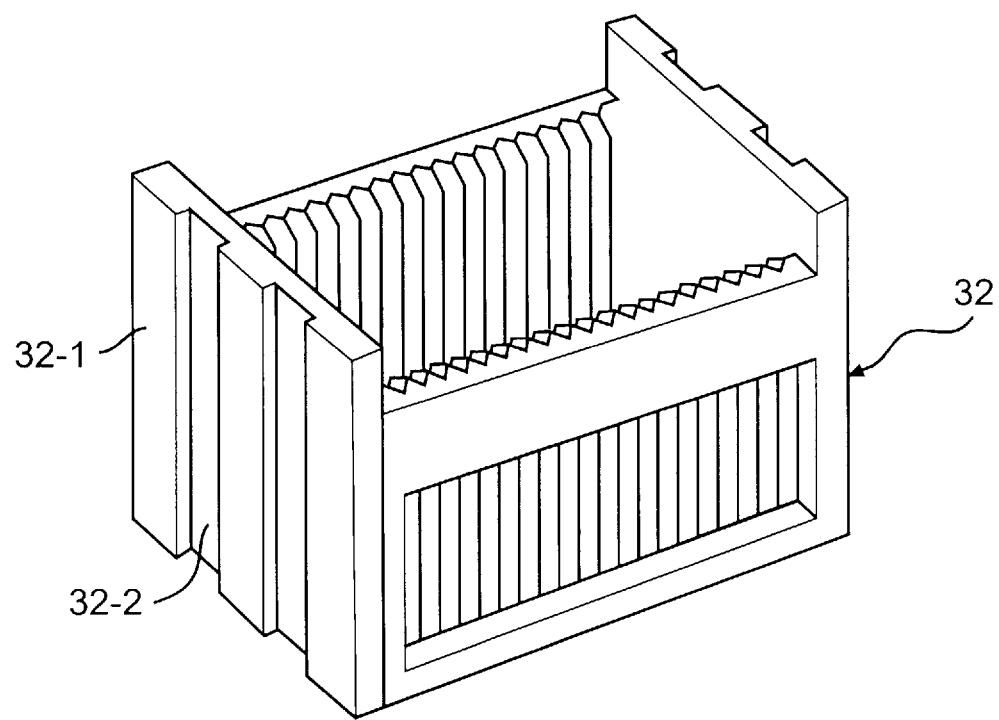

FIGS. 3A, 3B, and 3C are views showing a wafer set processing device of one embodiment according to the present invention. More specifically, FIG. 3A is a plan view of a wafer wet processing device, FIG. 3B is a cross-sectional view of the wafer wet processing device, and FIG. 3C is a perspective view of the wafer carrier.

The wafer wet processing device 30 of one embodiment according to the present invention as shown in FIGS. 3A, 3B, and 3C is a construction in which the inner face of wall 31-5 of a processing bath and the outer face of wall 32-1 of a wafer carrier are in contact with each other. The bottom of the processing bath 31 is formed of a baffle plate 31-1 through which holes having a constant interval are formed and an inlet 31-2. An exhaust conduit 31-3 is formed at the outer face of wall 31-5, and is provided with a drain hole 31-4.

The upper and lower face of the carrier 32 are open, and a plurality of plates 33 are disposed in an upright, arranged position in the carrier. The contact face between the processing bath wall and carrier wall, that is, a portion or the overall inner face of the processing bath wall and the outer face of the carrier wall are formed with opposing, complementary corrugated configurations.

Accordingly, most of the processing solution passes, by direct flow, through the carrier 32, causing a cleaning of the wafers and enhancing of the chemical reaction and exits over the exhaust conduit 31-3. The processing solution which flows over the exhaust conduit 31-3 is exhausted through the exhaust hole (outlet) 31-4, which is discharged as waste or recirculated after purifying the exhausted solution with a high performance filter.

Figure 4A:
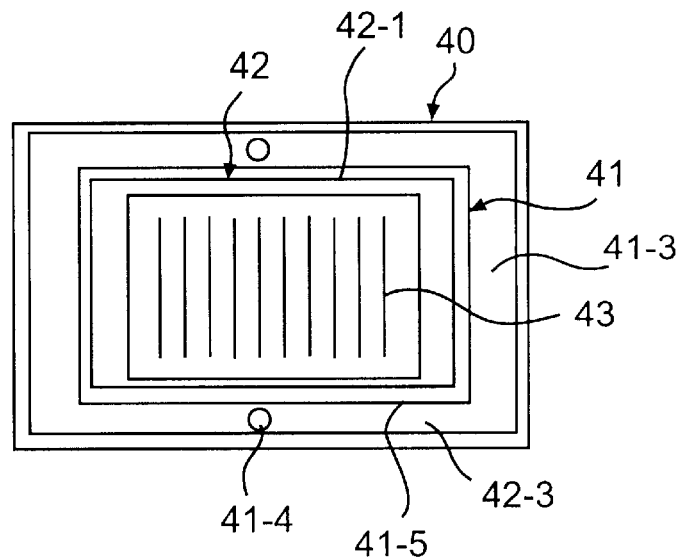
FIGS. 4A, 4B, and 4C are views showing other embodiments of a wafer set processing device according to the present invention.
Figure 4B:
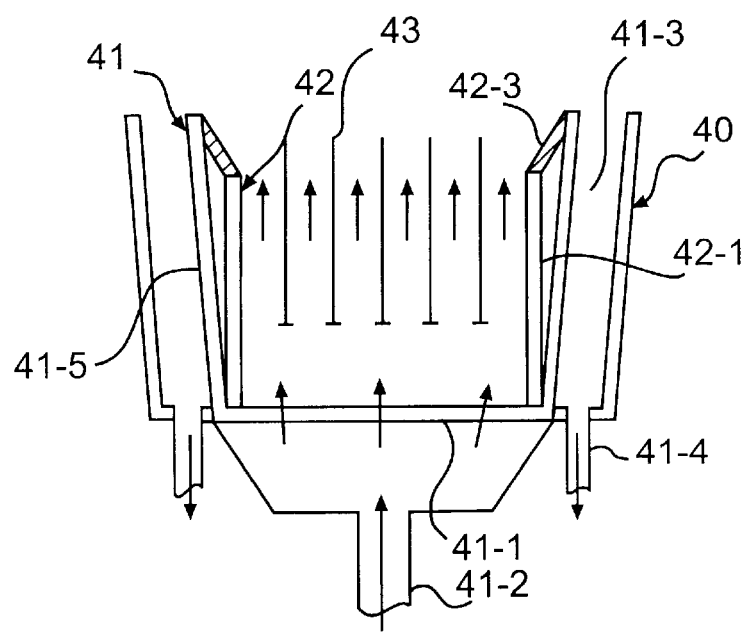
Figure 4C:
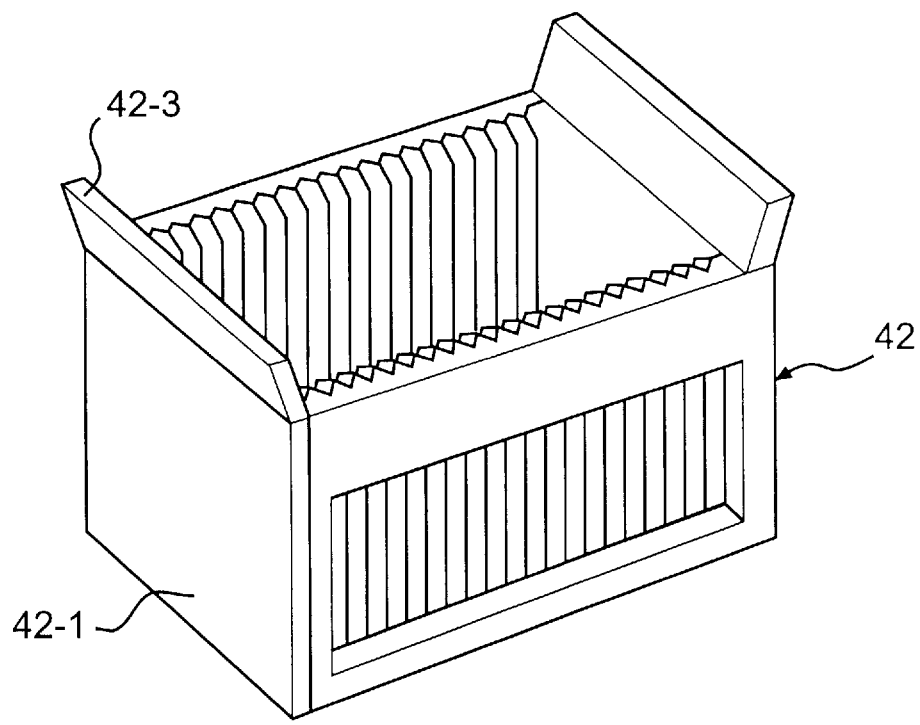
Figure 5A:
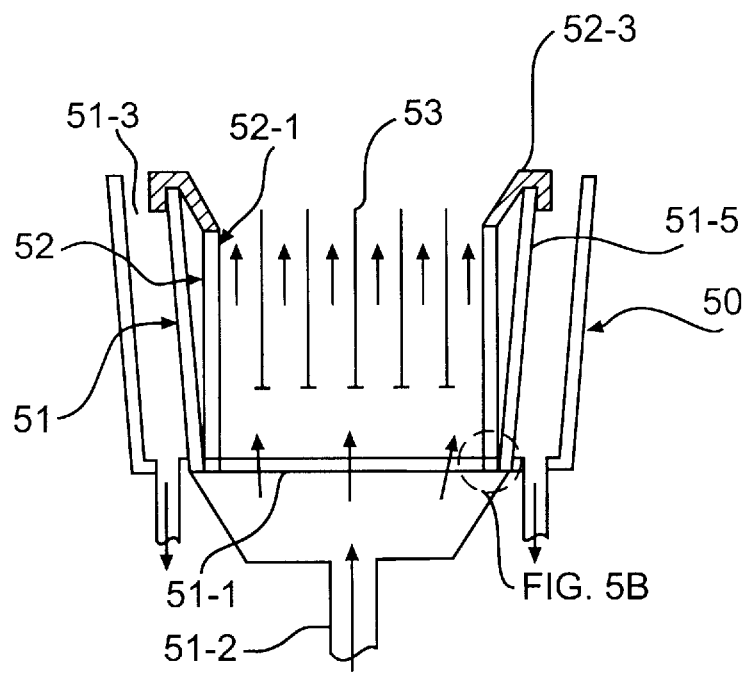
FIG. 5A is a view showing another embodiment of a wafer wet processing device according to the present invention.
Figure 5B:
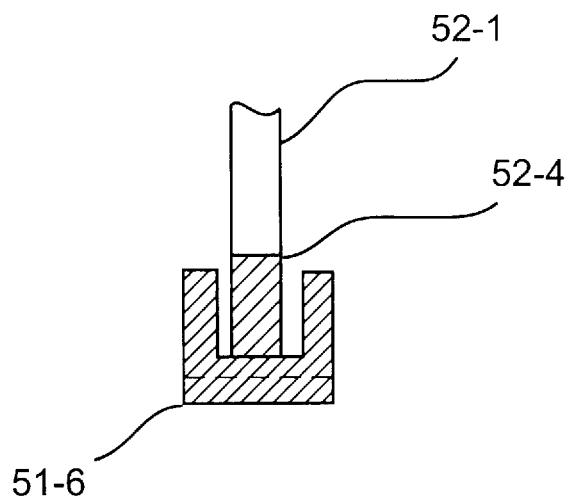
FIG. 5B is a detail of the lower portion of the carrier of FIG. 5A.

FIGS. 4A, 4B, and 4C are views showing another embodiment of a wafer set processing device according to the present invention, wherein FIG. 4A is a plan view of the wafer wet processing device; FIG. 4B is a cross-sectional view of the wafer wet processing device; and FIG. 4C is a perspective view of a wafer carrier.

In this embodiment, element 40, according to the present invention, is formed of an inclined face of 1°–15° between an inner face of the processing bath wall 41-5 and an outer face of the carrier wall 42-1 to minimize the occurrence of friction when inserting and removing the carrier 42 with respect to the processing bath 41. A wall portion of the carrier corresponding to the inclined face of the processing bath wall 41-5 is formed in an upright position to the height of the wafers, and the upper portion of the carrier wall is inclined outwardly and includes a guide portion 42-3 which contacts with the bath wall 41-5. At this time, since the portion of the carrier wall 42-1 corresponding to the inclined face of the processing bath wall is formed into a closed face and the processing solution cannot pass through the closed face, the entire amount of the processing solution introduced through the inlet conduit 41-2 and the baffle plate 41-1 passes through the inside of the wafer carrier 42 and is exhausted through the exhaust conduit 41-3. Since the baffle portion 42-3 of the upper portion of the carrier is inclined and makes contact with the processing bath wall, the overflow of the processing solution passing the carrier 42 is facilitated.

In addition, since the inclined inner face of the processing bath wall 41-5 increases the overflow effect of the processing solution in the processing bath after the process is finished, that is, after taking the carrier 42 out of the processing bath 41, the effect of removing residues remaining in the processing bath can be maximized. The reference numerals 41-2 and 41-4 are inlet holes and outlet holes, respectively.

FIG. 5 is a cross-sectional view showing another embodiment of the wafer wet processing device 50 according to the present invention. An overlapping baffle portion 52-3 is formed which covers the upper portion of the processing bath wall 51-5, and a projecting portion 52-4 is formed at the lower portion of the carrier 52. A grooved portion 51-6 corresponding to the projecting portion 52-4 is formed at the bottom of the processing bath for receiving said projecting portion.

Since the upper portion of the processing bath wall is wrapped in the baffle portion 52-3, the correct position insertion of the carrier 52 is facilitated. Also, the guided passage of the processing solution from inside the carrier 52 into the exhaust conduit 51-3 is facilitated.

Also, since the projecting portion 52-4 is formed at the lower portion of the carrier and the grooved portion 51-6 is formed at the bottom of the processing bath, the correct position insertion of the wafer carrier and the correct position maintenance is effectively achieved. It is desirable that the contacting portions between the projected portion 52-4 and grooved portion 51-6 are formed of materials which are wear-resistant, corrosionresistant, and capable of achieving a tight fit. The reference numerals 51-1, 51-2, 51-4, and 53 not described in FIG. 5 are a baffle plate, an inlet hole, an outlet hole, and wafers. Since the wafer wet processing device of the present invention minimizes the flow of the processing solution, the effect of the wafer wet processing device, such as achieving effective cleaning and effective chemical reaction, is maximized, making it possible to reduce the size of the device.

It will be apparent to those skilled in the art that various modifications and variations can be made in a wafer wet processing device of the present invention without departing from the spirit or scope of the invention. Thus, it is intended that the present invention cover the modifications and variations of the present invention provided they come within the scope of the appended claims and their equivalents.

What is claimed is:

1. A wafer wet processing device which comprises:
   a processing container containing side walls;
   means for introducing a processing solution to the lower portion of said container;
   means for removing the processing solution from the upper portion of said container; and
   a wafer carrier containing side walls and being open at the top and bottom thereof, said wafer carrier being slidably disposed within said processing chamber so that the processing solution is introduced within the wafer carrier, wherein the walls of the processing container are inclined away from the walls of the wafer carrier so that the respective walls are contiguous at the bottom portion but extended from each other at the top portion thereof.

2. The wafer wet processing device of claim 1, wherein the top portions of the respective walls of the processing container and the wafer carrier are connected by a guide means for directing the flow of the processing solution out of the wafer carrier.

3. The wafer wet processing device of claim 2, wherein the guide means which extends from the walls of the wafer carrier overlaps with the walls of the processing container.

4. The wafer wet processing device of claim 1, wherein the means for removing the processing solution includes an overflow channel which surrounds the wafer carrier for receiving overflow from said wafer carrier and outlet means connected to said overflow channel.

5. The wafer wet processing device of claim 1, wherein the means for introducing the processing solution includes a baffle plate provided with a plurality of apertures and inlet means communicating with said baffle plate.

6. The wafer wet processing device of claim 1, wherein the walls are inclined at an angle of 1 to 15 degrees.

7. A wafer set processing device which comprises:
a processing container containing side walls;
means for introducing a processing solution to the lower portion of said container;
means for removing the processing solution from the upper portion of said container; and
a wafer carrier containing side walls and being open at the top and bottom thereof, said wafer carrier being slidably disposed within said processing chamber so that the processing solution is introduced within the wafer carrier, wherein at least the lower portion of the side walls of said processing container is contiguous with the lower portion of the side walls of said wafer carrier and wherein the faces of the contiguous walls of the processing container and the wafer carrier are corrugated and complementary, relative thereto.

8. The wafer wet processing device of claim 7, wherein only the lower portion of the respective walls of the processing container and the wafer carrier are contiguous with each other.

9. The wafer wet processing device of claim 7, wherein the entire length of the respective walls of the processing container and the wafer carrier are contiguous with each other.

10. A wafer set processing device which comprises:
a processing container containing side walls;
means for introducing a processing solution to the lower portion of said container;
means for removing the processing solution from the upper portion of said container; and
a wafer carrier containing side walls and being open at the top and bottom thereof, said wafer carrier being slidably disposed within said processing chamber so that the processing solution is introduced within the wafer carrier; wherein at least the lower portion of the side walls of said processing container is contiguous with the lower portion of the side walls of said wafer carrier and wherein a projection portion is provided at the lower portion of said wafer carrier and a groove portion is provided at the bottom of the processing container for receiving said projection portion.

11. The wafer wet processing device of claim 10, wherein only the lower portion of the respective walls of the processing container and the wafer carrier are contiguous with each other.

12. The wafer wet processing device of claim 10, wherein the entire length of the respective walls of the processing container and the wafer carrier are contiguous with each other.

* * * * *